United States Patent [19]
Van Tran

[11] Patent Number: 5,815,435
[45] Date of Patent: Sep. 29, 1998

[54] STORAGE CELL FOR ANALOG RECORDING AND PLAYBACK

[75] Inventor: Hieu Van Tran, San Jose, Calif.

[73] Assignee: Information Storage Devices, Inc., San Jose, Calif.

[21] Appl. No.: 540,462

[22] Filed: Oct. 10, 1995

[51] Int. Cl.$^6$ .................................................. G11C 11/34
[52] U.S. Cl. ............................. 365/185.03; 365/185.11; 365/185.23; 365/185.24
[58] Field of Search .......................... 365/185.03, 185.11, 365/185.23, 185.24

[56] References Cited

U.S. PATENT DOCUMENTS

| | | | |
|---|---|---|---|
| 4,989,179 | 1/1991 | Simko | 365/185.03 |
| 5,126,967 | 6/1992 | Simko | 365/45 |
| 5,164,915 | 11/1992 | Blyth | 365/185.03 |
| 5,220,531 | 6/1993 | Blyth et al. | 365/45 |

*Primary Examiner*—David C. Nelms
*Assistant Examiner*—Trong Phan
*Attorney, Agent, or Firm*—Blakely, Sokoloff, Taylor & Zafman LLP

[57] ABSTRACT

A gate-follower storage cell and a diode-connected storage cell for use in integrated circuit analog signal recording and playback is disclosed. The gate-follower storage cell is used in negative feedback mode to provide a one to one variation between the cell threshold and the gate voltage in the read mode. The diode-connected storage cell is connected in a diode configuration to provide a one-to-one variation between the cell threshold and the gate voltage in the read mode. The gate-follower or diode-connected storage cells may be implemented in a memory array for storing analog signals. In a preferred embodiment, the memory array provides wordlines which are accessible through column drivers. Each row or wordline is divided into a plurality of sector wordlines by inserting select transistors in the array. Each sector is driven by a column driver. In the read and programming modes, the sector wordlines are isolated from each other and are provided to the column drivers through additional select transistors. Only one memory cell from each sector wordline is read or programmed at a given time. In the erase mode, all sectors of a wordline are connected together through the select transistors, so that the erase operation may be accomplished for a complete row at a given time.

24 Claims, 5 Drawing Sheets

STORAGE CELL FOR ANALOG RECORDING AND PLAYBACK

BACKGROUND OF THE INVENTION

1. Field of the Invention

The present invention relates generally to the field of non-volatile integrated circuit analog signal recording and playback systems.

2. Background of the Related Art

U.S. Pat. No. 5,220,531 ('531 patent) issued to Blyth et al. discloses an analog signal recording and playback integrated circuit which utilizes non-volatile memory integrated circuits. In that system, writing of the programming samples involves a multi-iterative process in which the programming pulses are divided into a series of coarse pulses and a series of fine pulses. The non-volatile memory cell is first programmed using the series of coarse pulses to approximately attain a desired programmed value. Thereafter, the series of fine pulses, referenced to the last coarse pulse, is used to obtain refined resolution of the memory cell storage.

As disclosed in U.S. Pat. No. 5,220,531, each memory cell may be programmed by first erasing the cell using the Fowler-Nordheim tunneling technique. This is accomplished by applying a high voltage, e.g., 21V on the gate of the memory cell, zero volts on the source, with the drain either floating or at zero volts. The high voltage on the gate couples the floating gate to a high voltage, creating a strong electric field across the tunnel oxide between the floating gate and the drain. This electric field causes the electrons to tunnel to the floating gate, effectively raising the threshold voltage ($V_T$) to about 6V. Next, the cell is programmed using the same Fowler-Nordheim tunneling mechanism by applying a high voltage on the drain, e.g., 9 to 19 volts, zero volts on the gate, and source floating at a precharged 6V. The high voltage on the drain causes a high electric field across the floating gate and the drain in the reverse direction, which causes electrons to tunnel from the floating gate to the drain, causing the threshold voltage to be lower (depleted), e.g., -1V to 3V depending on the voltage level on the drain and the pulse width.

The program pulse train is divided into a series of coarse pulses and a series of fine pulses to achieve refined resolution of the memory cell. In a preferred embodiment, the dynamic range of the cell is about 3V, with a resolution of about 12 millivolts (mV), effectively providing the equivalent of 8 bits (binary coded) of memory storage, since each cell can store 3000/12=250 levels. Each coarse pulse and each fine pulse is divided into a ramp up time portion and a flat time portion at the high voltage, followed by sample and compare time portions.

The compare time portion is used to read back the voltage stored in the memory cell after each incremental coarse or fine programming to see if it reaches a desired value. The sample time portion is used to sample the next sample of input signal and hold it. The sample and compare time portion is the quiet time, i.e., the high voltage source such as the charge pump is disabled for noise reason. The step voltage between successive coarse levels is approximately 220 mV and the step voltage between successive fine levels is approximately 22 mV, which is equivalent to 12 mV in the stored voltage in the memory cell.

A large step voltage for the coarse levels is required to cover the full range of the cell programming threshold window including additional voltage margin, which is approximately from 9 to 19 volts on the drain of the memory cell, which is corresponding to about 0–3V of the memory cell threshold voltage, which is approximately the analog dynamic range of the memory cell. In a preferred embodiment, 45 coarse pulses are selected to be utilized for programming, which translates into 45×220 mV=10 volts full range. Each coarse pulse is used to achieve-a short writing time. The fine ramp full range is chosen to be about 2V. Over 90 fine pulses, this gives a writing resolution of about 22 mV. A minimum period of time required for ramp up and another minimum period of time is required for the flat portion for cell programming.

The '531 patent utilizes a storage cell configured as a source-follower in the read mode, with a constant load current from the drain to ground. The gate and the source of the memory cell are connected together, while the drain of the memory cell is connected to a constant bias current, and the gate of the select transistor is connected to an intermediate voltage to eliminate the gate voltage drop effects and resistive effects due to the small size of the select gate. A regulated power supply is connected to the gate/source of the memory cell to avoid the variation of the gate/source voltage on the cell readout voltage, which is the voltage at the drain. Thus the cell is connected as a source-follower with its drain and source interchanged. This results in a one-to-one variation between the threshold of the cell and the cell readout voltage. The storage cell operates in the saturation region, with its gate and source effectively tied together.

SUMMARY OF THE INVENTION

A gate-follower storage cell and a diode-connected storage cell for use in integrated circuit analog signal recording and playback is disclosed. The gate-follower storage cell is configured in a negative feedback mode with a constant loading current logically connected from a high voltage supply to its drain. The drain is connected to a positive terminal of an operational amplifier, while the gate is logically connected to the output of the operational amplifier. A constant voltage source is connected to the negative terminal of the operational amplifier. The negative feedback provided by the operational amplifier forces the drain voltage of the memory cell to that of the reference voltage. The gate voltage of the cell (which is also the output of the operational amplifier) is the memory cell readout voltage. The gate-follower storage cell provides a one-to-one variation between the cell threshold and the gate voltage in the read mode when operating in the linear or saturation mode.

The diode-connected storage cell is provided in a diode-connected configuration (in which its drain and gate are tied together logically), with a constant loading current connected logically from a supply voltage to its gate/drain. The gate/drain voltage of the cell is the memory cell readout voltage. The diode-connected storage cell provides a one-to-one variation between the cell threshold and the gate voltage in the read mode when operating in the saturation mode.

The gate-follower storage cell and the diode-connected storage cell may be implemented in a memory array. In a preferred embodiment, the memory array provides wordlines which are accessible through column drivers. Each row or wordline is divided into a plurality of sector wordlines by inserting select transistors in the array. Each sector is driven by a column driver. In the read and programming modes, the sector wordlines are isolated from each other and are provided to the column drivers through additional select transistors. Only one memory cell from each sector wordline is read or programmed at a given time. In the erase mode, all sectors of a wordline are connected together through the select transistors, so that the erase operation may be accomplished for a complete row at a given time.

The advantages of the present invention in providing a diode-connected storage cell or a gate-follower storage cell over the source-follower storage cell are as follows. Since the source connection of the source follower storage cell is shared with all the memory cells in the array, it has a huge capacitance associated with it from all the diffusion junctions. In addition, in the read mode, assuming all the cells in the selected row have a low threshold voltage, the cells are conductive. Since the source and gate of the source follower cell being read is charged to a regulated voltage, for example 3.5V, all the bitlines in the array are also being charged to approximately the same voltage by all the other conductive memory cells. This means that in the read mode, the capacitive loading on the regulating circuit includes all the memory cell source junction capacitances and all the bitline capacitances. This puts a severe requirement on the regulating circuit. This also makes it difficult to extend the dynamic range of the memory cell, specially at the low voltage, because the heavy loading capacitance makes it difficult to pump up the regulating voltage. In the diode-connected storage cell and the gate-follower storage cell of the present invention, the voltages are read from the drain junction and hence the shared source junction capacitance has no effect. Also in the present invention, there is no regulating voltage on the source and hence there is no charging of the unselected bitlines.

DETAILED DESCRIPTION OF THE PREFERRED EMBODIMENT

One aspect of the present invention relates to a gate-follower storage cell which is configured in a negative-feedback mode to provide a one-to-one variation between the cell threshold and the cell gate voltage in the read mode. Another aspect of the present invention relates to a diode-connected storage cell which is provided in a diode-connected configuration to also provide a one-to-one variation between the cell threshold and the cell gate voltage in the readout mode. A third aspect of the present invention relates to a memory array which utilizes the gate-follower or diode-connected storage cells in conjunction with select transistors.

Figure 1:
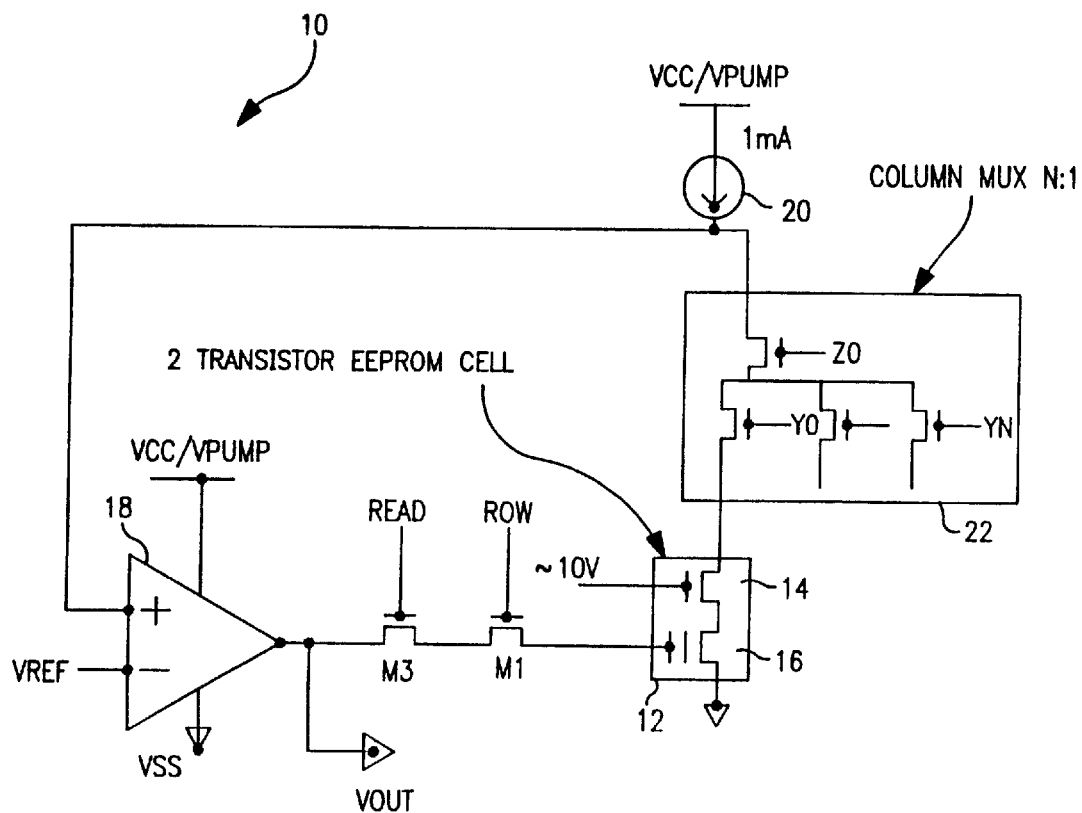
FIG. 1 is a schematic diagram of a portion of a memory array and a gate-follower storage cell in accordance with a preferred embodiment of one aspect of the present invention.

FIG. 1 is a schematic diagram of a portion of a memory array and a gate-follower read circuit in accordance with a preferred embodiment of one aspect of the present invention.

The gate-follower read circuit 10 includes a gate-follower memory cell 12 having two transistors 14 and 16, select transistors M1 and M3, and an operational amplifier 18. In a preferred embodiment, the transistor 16 is an Electrically Erasable Programmable Read-Only Memory ("EEPROM") transistor and the select transistors 14, M1 and M3 are N-channel Metal-Oxide Semiconductor ("NMOS") transistors. The select gate of memory cell 12, implemented through the gate of transistor 14, is connected to an intermediate voltage level, for instance, 10V, so as to eliminate gate voltage drop and resistive effects due to the small size of the select gate of transistor 14. A current source 20, which is supplied from a power supply VCC or a charge pump, provides the necessary constant loading current bias to the memory cell 12. In a preferred embodiment, the current source 20 is supplied through a charge pump, which extends the output range of the cell readout voltage. In particular, the drain of the select transistor 14 is coupled to the current source 20 via NMOS switches 22. In a preferred embodiment, the NMOS switches 22 are implemented using NMOS transistors Z0, Y0, ..., YN which are driven by a decoder (not shown). The NMOS switches 22 are used for column decoding when the read circuit 10 is implemented in a memory array, as will be described in detail in the following sections.

In one preferred embodiment, the gate voltages of the NMOS switches 22 are equal to zero when the memory cell 12 is deselected; when selected for programming, the gate voltages are high (e.g., 21V); and when selected to operate in the read mode, the gate voltages are at an intermediate level (e.g., 10V) so as to eliminate the gate voltage drop effects and resistive effects due to the small size of the decoding NMOS switches. The bias current provided by the current source 20 can be obtained from a regulated power supply to reject power supply variations. The bias current provided by the current source 20 (together with the operational amplifier 18) may be regulated from a charge pump so as to increase the dynamic range of the cell readout voltage. In addition, the bias current provided by the current source 20 may be implemented through the use of various cascading current mirror circuits to minimize power supply variation, as is known in the technology. Furthermore, the bias current provided by the current source 20 and the reference voltage VREF of the operational amplifier 18 may be supplied from a reference circuit such as a standard CMOS bandgap circuit.

In a preferred embodiment, the operational amplifier 18 is a MOS differential operational amplifier. The operational amplifier 18 obtains its voltage supply from either VCC or a standard charge pump output (the latter of which enables the operational amplifier 18 to extend its output range). The negative terminal of the operational amplifier 18 is connected to a reference voltage VREF while its positive terminal is connected to the drain of the select transistor 14 through the column decoding NMOS transistors 22. When operating in a read mode, a READ signal is asserted, which turns on select transistor M3, and when a ROW signal is asserted, NMOS transistor M1 is turned on, M1 and M3 turning on to connect the output of the operational amplifier 18 to the gate of transistor 16 in memory cell 12. The ROW signal is provided from a typical row decoder (not shown), as is known in the technology. The READ signal is designed to be equal to ground when disabled and equal to an intermediate voltage level (to eliminate gate voltage drop effects) when enabled while operating in the read mode.

Figure 3A:
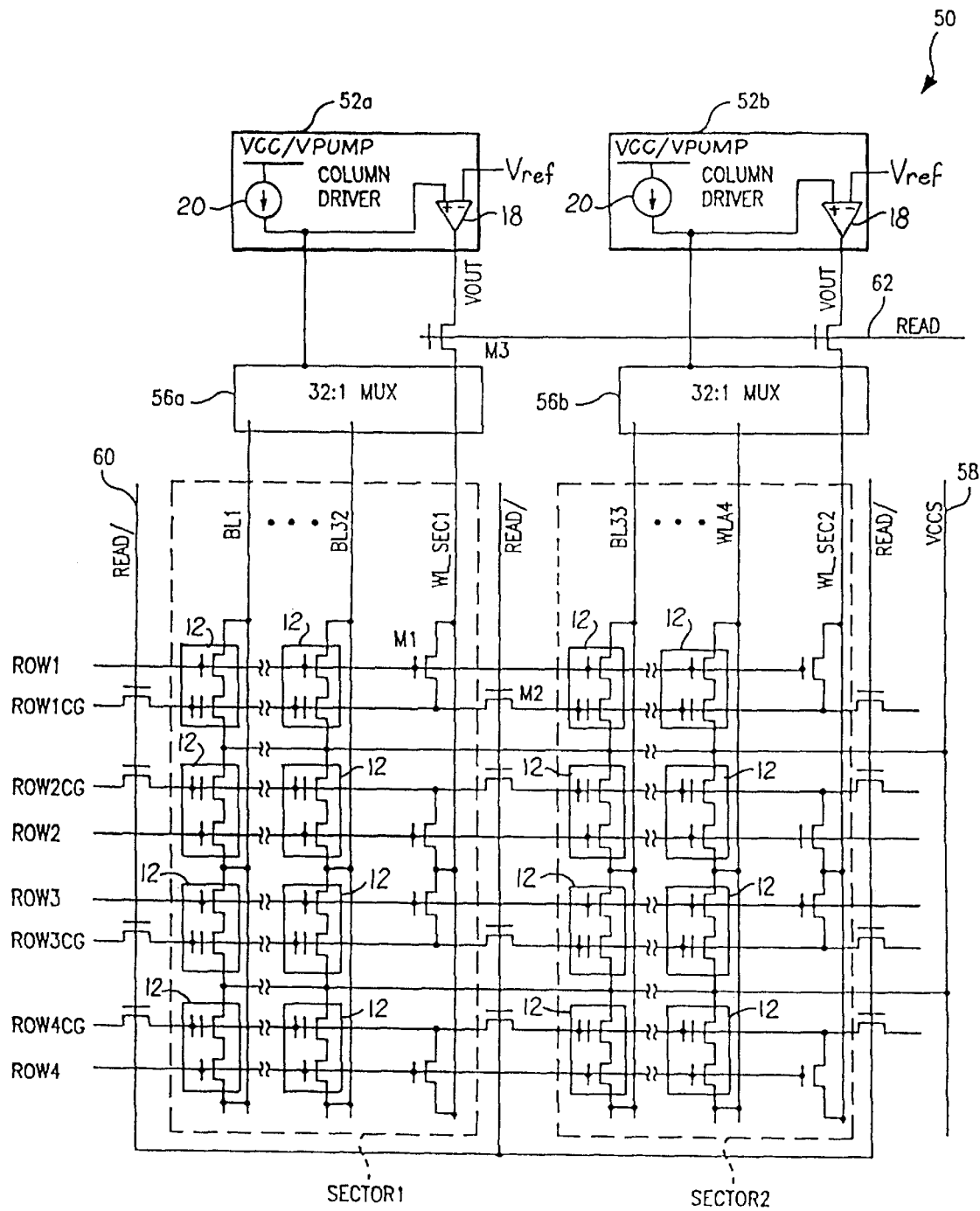
FIGS. 3A and 3B are schematic diagrams of preferred embodiments of a memory array utilizing the gate-follower storage cell and a diode-connected storage cell respectively, in accordance with a third aspect of the present invention.

The operational amplifier 18 may be implemented as part of the column driver circuit 52a or 52b in a memory array 50 as shown in FIG. 3A, which will be discussed in detail in the following sections. The column driver circuit 52a or 52b drives high voltage into a selected column during programming and also serves to read the cell readout voltage from memory cell 12. By negative feedback action, the operational amplifier 18 forces the drain voltage of the memory cell 12 to be equal to the reference voltage VREF.

The following linear MOS equation, as is known in the technology, is valid when the memory cell 12 is operating in the linear mode:

$$I=\text{beta}\,[(V_{gs}-V_t)V_{ds}-V_{ds}*V_{ds}/2]$$

where $V_{gs}>V_{ds}+V_t=>V_{gs}=I/(\text{beta}*V_{ds})+V_t+V_{ds}/2$.
Assuming that I=1 $\mu$A, $V_{ds}$=0.5V, beta=40 $\mu$A/V, one obtains the following results:

$$V_{gs}=1*10^{-6}/(40*10^{-6}*0.5)+V_t+0.25$$

$$V_{gs}=0.050+V_t+0.25$$

$$V_{gs}=0.3+V_t=\text{VOUT}$$

As can be observed, a one to one variation between the cell threshold voltage $V_t$ and VOUT ($V_{gs}$) is obtained. Note that a change in beta (for example, from mobility) results in a very small change in VOUT (Vgs).

The following saturation MOS equation, as is known in the technology, is valid, when the memory cell 12 is operating in the saturation mode:

$$I=0.5*\text{beta}[(V_{gs}-V_t)*(V_{gs}-V_t)],$$

where $V_{gs}<V_{ds}+V_t=>V_{gs}=\text{sqrt}\{I/(0.5*\text{beta})\}+V_t$
Assuming that I=1 $\mu$A, $V_{ds}$=0.5V, beta=40 $\mu$A/V, one obtains the following results $$=>V_{gs}=\text{sqrt}\{1*10^{-6}/(40*10^{-6}*0.5)\}+V_t$$

$$=>V_{gs}=0.224+V_t$$

$$=>V_{gs}=0.224+V_t=\text{VOUT}$$

Thus, a one-to-one variation between the cell threshold voltage Vt and VOUT ($V_{gs}$) is likewise obtained. Note that a variation in the value of beta similarly results in very small change in VOUT ($V_{gs}$).

Thus, a gate-follower read circuit 10 provided in a closed loop configuration via an operational amplifier 18 which forces a constant voltage on the drain of the memory cell 12, provides a linear relationship between the gate and the threshold voltage of the memory cell 12, whether the cell 12 operates in saturation or the linear region.

Since such a one-to-one variation can only be achieved if the beta variation is kept to a minimum, the bias current provided by the current source 20 should be chosen to be sufficiently small, whether the cell 12 is operating in the saturation or the linear mode. In addition, the bias current provided by the current source 20 may be temporarily increased for a short duration at the beginning of the read process to reduce the settling time of the loop. Furthermore, variation of VOUT over a temperature range may be minimized by utilizing a reference scheme as described in U.S. Pat. No. 5,126,967 issued to Simko, which patent is assigned to the assignee of the present invention and incorporated herein by reference.

Figure 2:
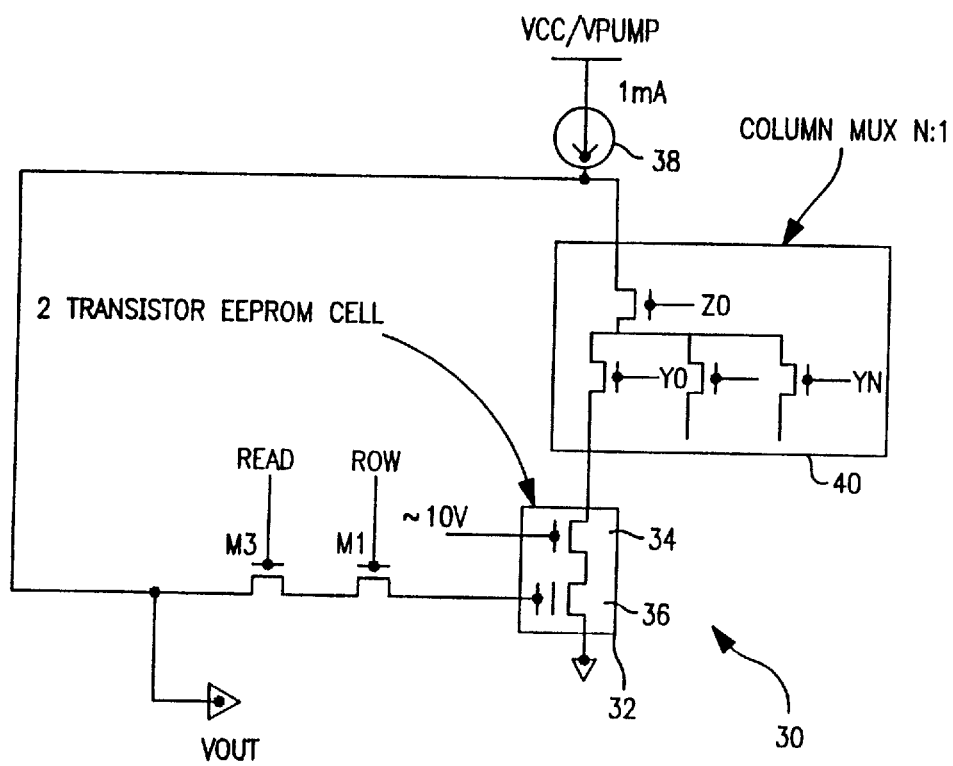
FIG. 2 is a schematic diagram of a portion of a memory array and a diode-connected storage cell in accordance with a preferred embodiment of a second aspect of the present invention.

FIG. 2 is a schematic diagram of a portion of a memory array and a diode-connected read circuit in accordance with a preferred embodiment of a second aspect of the present invention. The diode-connected read circuit 30 includes a diode-connected memory cell 32 which having two transistors 34 and 36, and select transistors M1 and M3. In a preferred embodiment, the transistor 36 is an EEPROM transistor and select transistors 34, M1 and M3 are NMOS transistors. The select gate of transistor 34 of the memory cell 32 is connected to an intermediate voltage level, e.g., 10V, so as to eliminate gate voltage drop effects and resistive effects due to the small size of the select gate.

In a preferred embodiment, M1 and M3 are used to connect the gate of transistor 36 (which also serves as the gate of the memory cell 32), to the drain of the memory cell 32 in the read mode. M3 is enabled by a READ signal while M1 is enabled by a ROW signal. When deselected, the READ and ROW signals are equal to ground. When operating in the read mode, the READ and ROW signals are equal to an intermediate voltage level (10V) so as to fully pass the maximum cell gate/drain voltage. M3 is turned off during programming.

A current source 38 which provides a bias current is provided from a power supply VCC or a charge pump to the drain of the select transistor 34 of the memory cell 32 through NMOS switches 40 which are used for column decoding. The gate voltages of the NMOS switches 40 are equal to ground when deselected; equal to a high voltage (e.g., 21V) when selected for programming; and equal to an intermediate voltage level (e.g., 10V, to eliminate the gate voltage drop effect and resistor effect from small size of the decoding switches 40) when selected in read mode. The bias current provided by the current source 38 can be regulated from a power supply VCC to alleviate power supply variations. It may also be regulated from a charge pump to increase the dynamic range of the cell readout voltage. In addition, the bias current provided by the current source 38 may be implemented through the use of various cascoding current mirror circuits to minimize power supply variation, as known in the technology. Furthermore, the bias current may be supplied from a reference circuit such as a standard CMOS bandgap circuit.

When the READ signal and the ROW signal are asserted (equal to approximately 10V), M3 and M1 turn on, connecting the memory cell 32 in a diode configuration. Assuming the cell threshold is larger than zero, this would cause the memory cell 32 to operate in the saturation mode. Thus, the following saturation MOS equation, as is known in the technology, holds true:

$$I=0.5*\text{beta}\,[(Vgs-Vt)*(Vgs-Vt)],\,Vgs<Vds+Vt=>Vgs=\text{sqrt}\{I/(0.5*\text{beta})\}+Vt$$

assuming I=1 $\mu$a, beta=40 $\mu$A/V, the following results $$=>Vgs=\text{sqrt}\{1\times10^{-6}/(40\times10^{-6}*0.5)\}+Vt$$

$$=>Vgs=0.224+Vt$$

$$=>Vgs=0.224+Vt=\text{VOUT}$$

Thus, a one-to-one variation between the Vt and VOUT (Vgs) is obtained in the read mode. Beta variation (for example from mobility) which results in a change in VOUT (Vgs) may be minimized by choosing a small bias current 38(as provided by current source). In addition, the variation of VOUT over a range of temperature may be minimized by utilizing a reference scheme such as that described in U.S. Pat. No. 5,126,967 issued to Simko and assigned to the assignees of the present invention.

Programming of each storage cell 12 or 32 may be performed by any suitable means as known in the technology. An example of such programming is described in U.S. Pat. No. 5,220,531, which is assigned to the assignee of the present invention and which is incorporated herein and discussed in earlier sections.

Figure 3B:
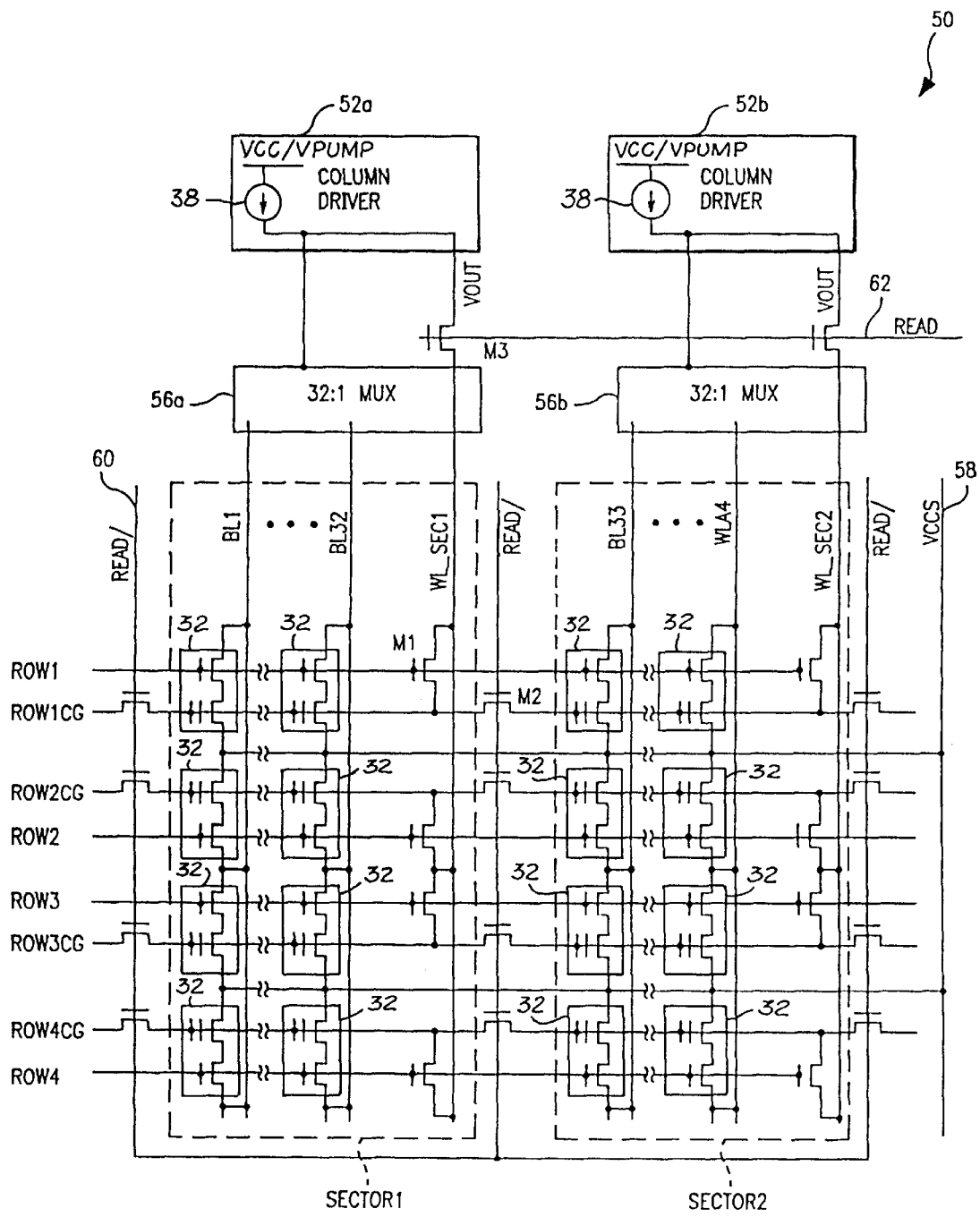

FIGS. 3A and 3B are schematic diagrams of preferred embodiments of a memory array utilizing the gate-follower storage cell and a diode-connected storage cell respectively, in accordance with a third aspect of the present invention. The memory array 50 may be implemented using either the gate-follower storage cell 12 or (FIG. 3A) the diode-connected storage cell 32 (FIG. 3B). For discussion purposes, the memory array 50 is shown in FIGS. 3A and 3B to includes 4 rows (ROW1–ROW4), 2 sectors (SECTOR1 and SECTOR2) and two column drivers 52a and 52b. As is apparent to one skilled in the art, fewer or a greater number of rows, sectors or column drivers may be implemented in accordance with design goals. The following discussion will be provided with reference to both FIGS. 3A and 3B.

In the present preferred embodiment, each sector (SECTOR1 or SECTOR2) includes 32 columns BL1–BL32 and a single column driver 52a or 52b which is connected to the 32 columns through a 32:1 multiplexer 56a and 56b respectively. Each column driver 52a or 52b includes a high voltage column switch circuit (not shown) for selectively supplying high voltage to memory cell during programming, a sample-and-hold circuit (not shown) for sample and holding the next analog input signal, a compare circuit (not shown) for comparing the readout voltage of the memory cell 12 (FIG. 3A) or 32 (FIG. 3B) with the analog input signal after each incremental programming pulse to determine if the memory cell desired threshold is attained, and a read circuit 10 (FIG. 3A) or 30 (FIG. 3B) for reading the memory cell threshold voltage. In one embodiment, the column driver as described in U.S. Pat. No. 5,220,531 to Blyth et al., which is assigned to the assignee of the present invention, and which is incorporated by reference herein, may be utilized as column driver 52a or 52b, with the exception that the read circuit 10 (FIG. 3A) or 30 (FIG. 3B) as described above, is implemented in the column driver 52a or 52b.

As discussed, the memory array 50 may be implemented using either the gate-follower storage cell 12 (FIG. 3A) or the diode-connected storage cell 32 (FIG. 3B). In utilizing the gate-follower storage cell 12 as shown in FIG. 1, the gate-follower read circuit 10 is implemented such that the bias current provided by the current source 20 and the operational amplifier 18 are implemented as part of the column driver circuit 52a or 52b in the memory array 50 as shown in FIG. 3A. The column driver circuit 52a or 52b drives high voltage into a selected column during programming and also serves to read the voltage out of the memory cell 12. By negative feedback action, the operational amplifier 18 will force the drain voltage of the cell 12 to be equal to the reference voltage VREF. In this embodiment, the 32:1 multiplexer 56 is implemented using the NMOS switches 22.

In utilizing the diode-connected storage cell 32 as shown in FIG. 2, the diode-connected read circuit 30 is implemented as part of the column driver circuit 52a or 52b in memory array 50, as shown in FIG. 3B, such that the bias current provided by the current source 38 is implemented as part of the column driver circuit 52a or 52b. The column driver circuit 52a or 52b drives high voltage into a selected column during programming and also serves to read the voltage out of the memory cell 12. In this embodiment, the 32:1 multiplexer 56 is implemented using the NMOS switches 40.

The NMOS switches 22 or 40 include a select transistor Z0 connected in series with a plurality of transistors Y0, Y1, . . . , YN (where N is equal to 32 and select transistor Z0 is not needed when the NMOS switches 22 or 40 are implemented as a straight decoded 32 to 1 multiplexer 56), which are coupled in parallel. The transistors Y0–YN are used for straight column decoding. Transistors Z0–ZM ( where Z1, Z2, . . . , ZM are not shown) may be used in conjunction with Y0–YN for column decoding utilizing fewer signal lines, as is known in the technology, for example, to implement a 32 to 1 multiplexer Z0–Z1 together with Y0–Y15 could be used. Each of transistors Y0, Y1, . . . , YN corresponds to a storage cell 12 or 32 in each column BL1, BL2, . . . , BL32 in the memory array 50. Each of the transistors Y0, Y1, . . . , YN are turned on in accordance with a column decoder (not shown) when implemented in the memory array 50, which in turn, turns on a corresponding storage cell 12 or 32 in each column BL1, BL2, . . . , BL32 of each sector SECTOR1 and SECTOR2.

A source line metal strap (VCCS) 58 is provided for every 64 columns or every 2 sectors in the memory array 50. VCCS 58 is connected to ground in the read and erase modes, and floats (or precharged at 6V) during programming. In addition, for every 32 columns BL1–BL32 or BL33–BL64 in each sector SECTOR1 or SECTOR2, respectively, a select transistor M2 is used for wordline (or row) division, so that each wordline is divided into sector wordlines. The select transistor M1 of the read circuit 10 or 30 as shown in FIG. 1 or FIG. 2 is used for wordline selection so that when the signal provided on ROW1, ROW2, ROW3 or ROW4 is asserted high, all transistors M1 for that particular row turn on. The select transistor M3 of the read circuit 10 or 30 as shown in FIG. 1 or FIG. 2 is used to pass the wordline of the selected memory cell 12 or 32 to the column driver 52a or 52b, . . . , 52(50) during the read operation, as will be described in detail in the following sections.

A READ/ signal provided on signal line 60 provides the voltage required for turning on M2 during programming and erase. Signal line 62 provides a READ signal, which when asserted, provides the voltage required for turning on M3 during the read operation. Furthermore, for every 32 columns BL1–BL32 or BL33–BL64 in each sector SECTOR1 or SECTOR2, respectively, a signal line WL_SEC1 or WL_SEC2 respectively, is provided to facilitate reading of the memory cell 12 or 32 threshold voltage. This threshold voltage is provided to output terminal VOUT.

Figure 4:
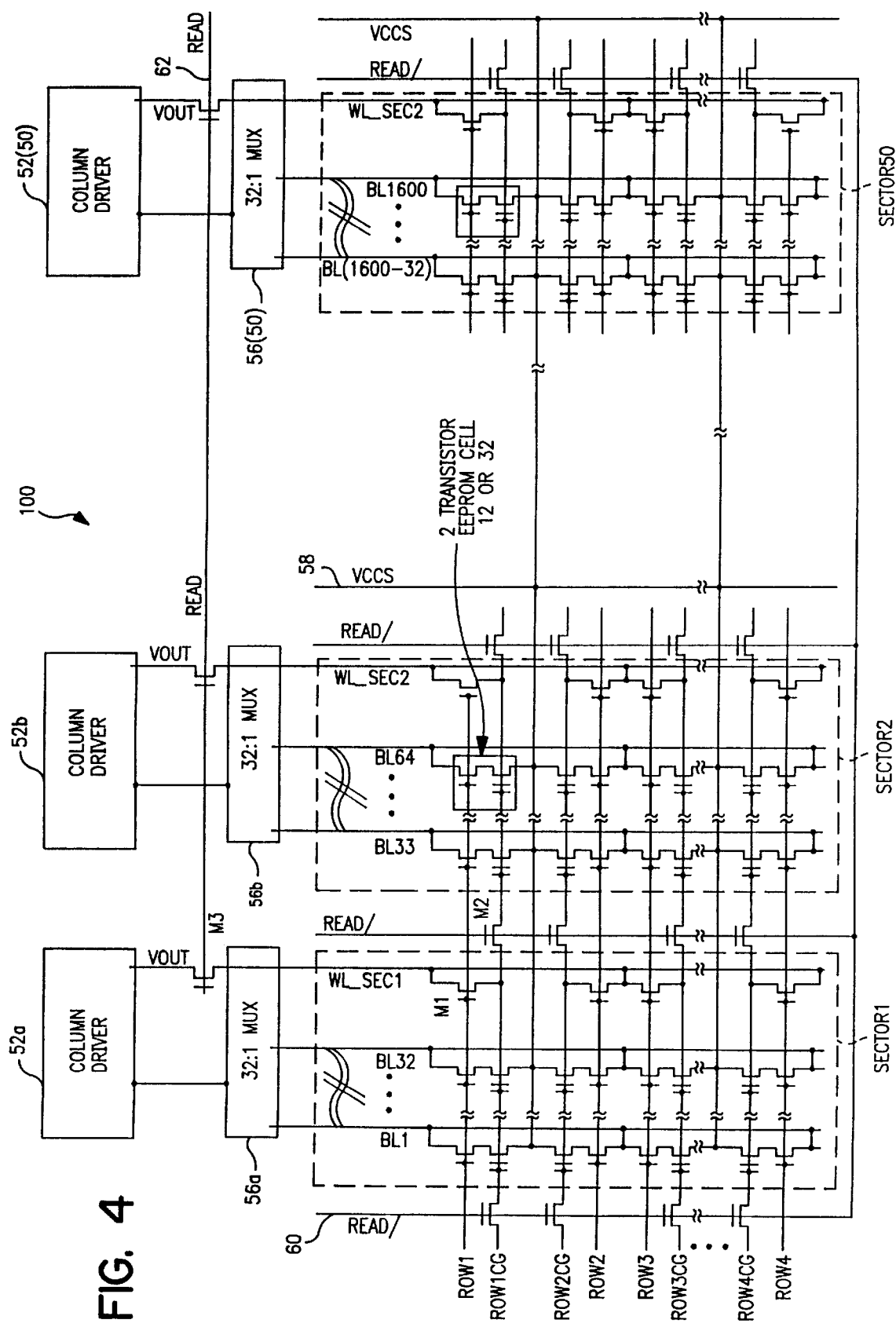
FIG. 4 is a schematic diagram of a preferred embodiment of a fifty-sector memory array provided in accordance with the teachings of the present invention.

An exemplary memory array for storing analog signals to provide 60 seconds of audio signals will now be described. FIG. 4 is a schematic diagram of a preferred embodiment of a fifty-sector memory array in accordance with the teachings of the present invention. With a sampling rate of 8 Khz, ⅛ Khz=125 $\mu$s of an audio signal may be stored in one memory cell 12 or 32. The size of the memory array 100 necessary for storing a signal of 60 seconds will thus be: 60 seconds/ $125 \times 10^{-6}$=480,000 memory cells 12 or 32. For present discussion purposes and as illustrated in FIG. 4, the memory array 100 is divided into 1600 columns and 300 rows. As is apparent to one skilled in the art, other divisions or designations are possible. As discussed above, one column driver 52(1) or 52(2) is required for driving 32 columns through a 32:1 multiplexer 56. In addition, 50 column drivers 56(1)–56(50) (1600 columns/32) are required to drive 1600 columns in the present example.

During the programming and erase modes, the READ signal is asserted low, and a high voltage, for example, 21V, is provided on signal line 60, so that the READ/ signal is asserted high, which turns on all M2 transistors, connecting all 50 sectors of one wordline (or row) together, for example, ROW1CG of SECTOR1 through SECTOR50. At the same time, since the READ signal provided on signal line 62 is asserted low, M3 is turned off, effectively isolating the high voltage provided on the wordline ROW1CG from the read circuit in the column driver 52(1), 52(2), . . . , 52(50).

To program the memory cells 12 or 32 in ROW1CG, column BL32 of each of the 50 sectors, the voltage provided to ROW1 is a high voltage, e.g., 21 v, and to ROWCG1 is low, e.g., 0V. The voltage provided to each thirty-second of each sector, column BL32, BL64, . . . , BL1600 is 9–19V, and VCCS is floating or precharged at 6V. As discussed, programming is accomplished by the 50 column drivers 56(1)–56(50) through selecting the memory cells 12 or 32 in one of 32 columns through 50 corresponding 32:1 multiplexers 56(1)–56(50) for a particular selected row. Thus, the column drivers 56(1)–56(50) need to write 32 times (through 32 scans, with one write scan programming one column in each of the 50 sectors) to program all the memory cells 12 or 32 of an entire row, for example, ROW1CG.

In contrast, an entire row of memory cells 12 or 32 may be erased through the erase operation through a single erase operation. To erase the contents of a memory cell 12 or 32 of ROW1CG, the READ signal is asserted low, while the signals provided on ROW1 and ROW1CG are high, e.g., 21V. The voltages provided to ROW2, ROW3, . . . , ROW300 to the columns of all 50 sectors (BL1–BL1600) and to VCCS, are all zero. When thus configured, the memory cells 12 or 32 or ROW1CG are all erased.

Table 1 illustrates the voltage levels for various nodes during the erase, programming and read modes for memory cells 12 or 32 in ROW1, ROW1CG, columns BL32 and BL64.

TABLE 1

|  | ERASE | PROGRAMMING | READ |
|---|---|---|---|
| READ | 0 | 0 | 10 |
| READ/ | 21 | 21 | 0 |
| ROW1 | 21 | 21 | 10 |
| ROW1CG | 21 | 0 | 0 |
| ROW2–4 | 0 | 0 | 0 |
| ROW2–4CG | 0 | 0 | 0 |
| BL1 | 0 | FL | FL |
| BL32 | 0 | 9–19 | Ibias |
| BL33 | 0 | FL | FL |
| BL64 | 0 | 9–19 | Ibias |
| VCCS | 0 | FL or FL @ 6V | 0 | where FL = float and the read bias current applied through column multiplexer 56, Ibias = 1 μA.

During a read operation, the READ signal is asserted high, so that the READ/ signal is low, which in turn shuts off all M2 transistors. This results in dividing a row into 1600/32=50 sectors. The transistors M1 are turned on by a row decoder (not shown). The READ signal which is asserted high (equal to approximately 10V) also turns on M3, so that the voltage provided on each wordline WL_SEC1 . . . WL_SEC50 of each of the fifty sectors are provided to the corresponding column driver 56(1)–56(50). Each sector SECTOR1–SECTOR50 is driven by a column driver 52(1)–52(50) through a corresponding 32:1 multiplexer 56(1)–56(50).

Each wordline (gate of memory cells) is passed through a select transistor M1, selected by the row decoder to the column driver 52(1), . . . , 52(50). With one row selected and one sector selected for each column driver 52(1) . . . 52(50), only the wordline of one selected memory cell 12 or 32 is passed to column driver 52(1) . . . 52(50). The memory cell 12 or 32 in each column is selected by the corresponding 32:1 multiplexer 56(1)–56(50).

Note that the above analyses using the equivalent MOS equation of the gate-follower storage cell 12 and diode-connected storage cell 32 ignore the effect of the voltage coupling from the drain of the memory cell 12 or 32 respectively into the floating gate. However, even with the drain coupling taken into account, the relationship between the memory cell threshold and the cell read-out voltage is still linear.

The present invention thus provides an integrated circuit analog signal recording and playback system which stores an analog signal utilizing non-volatile memory in a gate-follower or a diode-connected storage cell.

Modifications and variations of the embodiments described above may be made by those skilled in the technology while remaining within the true scope and spirit of this invention. For instance, the present invention may be implemented utilizing source-follower memory cells as described in U.S. Pat. No. 5,220,531 issued to Blyth et al., which is assigned to the assignee of the present invention, the subject matter of which is incorporated herein. In addition, the memory cells 12 or 32 and the memory array 50 or 100 may be programmed utilizing any suitable means as known in the technology.

Thus, although the present invention has been described in terms of certain preferred embodiments, other embodiments that will be apparent to those of ordinary skill in the technology are also within the scope of this invention. Accordingly, the scope of the invention is intended to be defined only by the claims which follow.

What is claimed is:

1. A circuit for storing and reading back an analog voltage for integrated circuit signal recording and subsequent playback comprising:

a storage cell having a first transistor and a second transistor, the first transistor having a source, a drain and a gate, the second transistor having a source, a drain, a gate and a floating gate, the drain of the second transistor being connected to the source of the first transistor;

a current source coupled to the drain of the first transistor;

a third transistor having a source, a drain and a gate, the drain of the third transistor being coupled to the current source, the source of the third transistor being coupled to the gate of the second transistor, the gate of the third transistor being coupled to an input signal, the third transistor being responsive to the input signal; and an output terminal coupled to the drain of the third transistor for providing the analog voltage stored in the storage cell when the third transistor is turned on in response to the input signal.

2. The circuit of claim 1, wherein the gate of the second transistor is coupled to the drain of the first transistor when the third transistor is turned on.

3. The circuit of claim 2, wherein the storage cell has a cell threshold voltage and a cell gate/drain voltage and wherein the storage cell operates in the saturation region.

4. The circuit of claim 3, wherein the storage cell provides a cell gate/drain voltage which varies linearly with respect to the cell threshold voltage.

5. The circuit of claim 1, further comprising a switch connected between the current source and the first transistor.

6. The circuit of claim 5, wherein the switch comprises a fourth transistor having a source, a drain and a gate, the drain of the fourth transistor being coupled to the current source, the source of the fourth transistor being coupled to the drain of the first transistor, the gate of the fourth transistor being responsive to a select signal.

7. The circuit of claim 1, further comprising an operational amplifier having a first input terminal, a second input terminal and an amplifier output, the first input terminal being coupled to the drain of the first transistor and to the current source, the amplifier output being coupled to the output terminal.

8. The circuit of claim 7, wherein the analog voltage provided at the output terminal is the gate voltage of the second transistor when the third transistor is turned on.

9. The circuit of claim 8, wherein the storage cell has a cell threshold voltage and a cell gate/drain voltage and wherein the storage cell operates in the linear region to provide a cell gate/drain voltage which varies linearly with respect to the cell threshold voltage.

10. The circuit of claim 9, wherein the storage cell has a cell threshold voltage and a cell gate/drain voltage and wherein the storage cell operates in the saturation region to provide a cell gate/drain voltage which varies linearly with respect to the cell threshold voltage.

11. The circuit of claim 7, further comprising a switch connected between the current source and the first transistor.

12. The circuit of claim 11, wherein the switch comprises a fourth transistor having a source, a drain and a gate, the drain of the fourth transistor being coupled to the current source, the source of the fourth transistor being coupled to the drain of the first transistor, the gate of the fourth transistor being responsive to a select signal.

13. A circuit for storing and reading back signal samples for integrated circuit recording and subsequent playback, comprising:

a plurality of sectors, each sector having a plurality of storage cells, each storage cell including a first transistor and a second transistor, the first transistor having a source, a drain and a gate, the second transistor having a source, a drain, a gate and a floating gate, the drain of the second transistor being connected to the source of the first transistor, the plurality of storage cells being arranged in a plurality of rows and columns;

a plurality of column drivers for driving the storage cells in the columns, each column driver being associated with one of the plurality of sectors;

a plurality of multiplexers each associated with one of the plurality of column drivers for accessing the storage cells in a column;

wordline sectoring means for accessing the storage cells in each row;

wherein the storage cells in each sector of each row are accessible when the first transistor is turned on.

14. The circuit of claim 13, wherein the gate of the second transistor is coupled to the drain of the first transistor when the third transistor is turned on.

15. The circuit of claim 14, wherein the storage cell has a cell threshold voltage and a cell gate/drain voltage and wherein the storage cell operates in the saturation region.

16. The circuit of claim 15, wherein the storage cell provides a cell gate/drain voltage which varies linearly with respect to the cell threshold voltage.

17. The circuit of claim 13, further comprising a plurality of current sources and a plurality of switches each connected between the first transistor and a corresponding one of the plurality of current sources.

18. The circuit of claim 17, wherein the switch comprises a plurality of transistors each having a source, a drain and a gate, the drain of each transistor being coupled to a corresponding one of the plurality of current sources, the source of each transistor being coupled to the drain of the first transistor, the gate of each transistor being responsive to a select signal.

19. The circuit of claim 13, further comprising a plurality of current sources, an operational amplifier having a first input terminal, a second input terminal and an amplifier output, the first input terminal being coupled to the drain of the first transistor and to a corresponding one of the plurality of current sources, the amplifier output being coupled to an output terminal.

20. The circuit of claim 19, wherein said wordline sectoring means is a third transistor, and wherein a signal sample provided at the output terminal is the gate voltage of the second transistor when the third transistor is turned on.

21. The circuit of claim 20, wherein the storage cell has a cell threshold voltage and a cell gate/drain voltage and wherein the storage cell operates in the linear region to provide a cell gate/drain voltage which varies linearly with respect to the cell threshold voltage.

22. The circuit of claim 21, wherein the storage cell has a cell threshold voltage and a cell gate/drain voltage and wherein the storage cell operates in the saturation region to provide a cell gate/drain voltage which varies linearly with respect to the cell threshold voltage.

23. The circuit of claim 22, further comprising a switch connected between the first transistor and a corresponding one of the plurality of current sources.

24. The circuit of claim 23, wherein the switch comprises a plurality of transistors each having a source, a drain and a gate, the drain of each transistor being coupled to one of the plurality of current sources, the source of each transistor being coupled to the drain of the first transistor, the gate of each transistor being responsive to a select signal.

* * * * *